United States Patent
Lee et al.

(10) Patent No.: US 7,005,373 B2
(45) Date of Patent: Feb. 28, 2006

(54) METHOD FOR FORMING A METAL SILICIDE LAYER IN A SEMICONDUCTOR DEVICE

(75) Inventors: Eung-Joon Lee, Suwon-si (KR); In-Sun Park, Yongin-si (KR); Kwan-Jong Roh, Anyang-si (KR)

(73) Assignee: Samsung Electronics, Co., Ltd., (KR)

( * ) Notice: Subject to any disclaimer, the term of this patent is extended or adjusted under 35 U.S.C. 154(b) by 78 days.

(21) Appl. No.: 10/790,921

(22) Filed: Mar. 2, 2004

(65) Prior Publication Data

US 2004/0175890 A1 Sep. 9, 2004

(30) Foreign Application Priority Data

Mar. 7, 2003 (KR) .................. 10-2003-0014406

(51) Int. Cl.
 *H01L 21/4763* (2006.01)

(52) U.S. Cl. .................................... 438/630
(58) Field of Classification Search ................ 438/630
 See application file for complete search history.

(56) References Cited

U.S. PATENT DOCUMENTS

| 6,103,610 A | * | 8/2000 | Blair ........................ 438/592 |
| 6,344,388 B1 | | 2/2002 | Oishi et al. ................ 438/241 |
| 6,391,750 B1 | * | 5/2002 | Chen et al. ................ 438/583 |

* cited by examiner

*Primary Examiner*—Asok Kumar Sarkar
(74) *Attorney, Agent, or Firm*—Mills and Onello, LLP

(57) ABSTRACT

On first and second regions of a substrate are formed a first gate structure including a first gate electrode and a first spacer, and a second gate structure including a second gate electrode and a second spacer, respectively. The first and second spacers are removed to different depths such that side portions of the first and second gate electrodes have different exposed thicknesses. A metal silicide layer is formed on the first and second regions including the first and second gate structures. The metal silicide layer formed on the second gate electrode has a second thickness that is greater than a first thickness of the metal silicide layer formed on the first gate electrode. The spacers in the gate structures of resulting N type and P type MOS transistors are removed to different thicknesses, thereby minimizing deformation in the gate structures and also improving electrical characteristics and thermal stability of the gate electrodes.

10 Claims, 13 Drawing Sheets

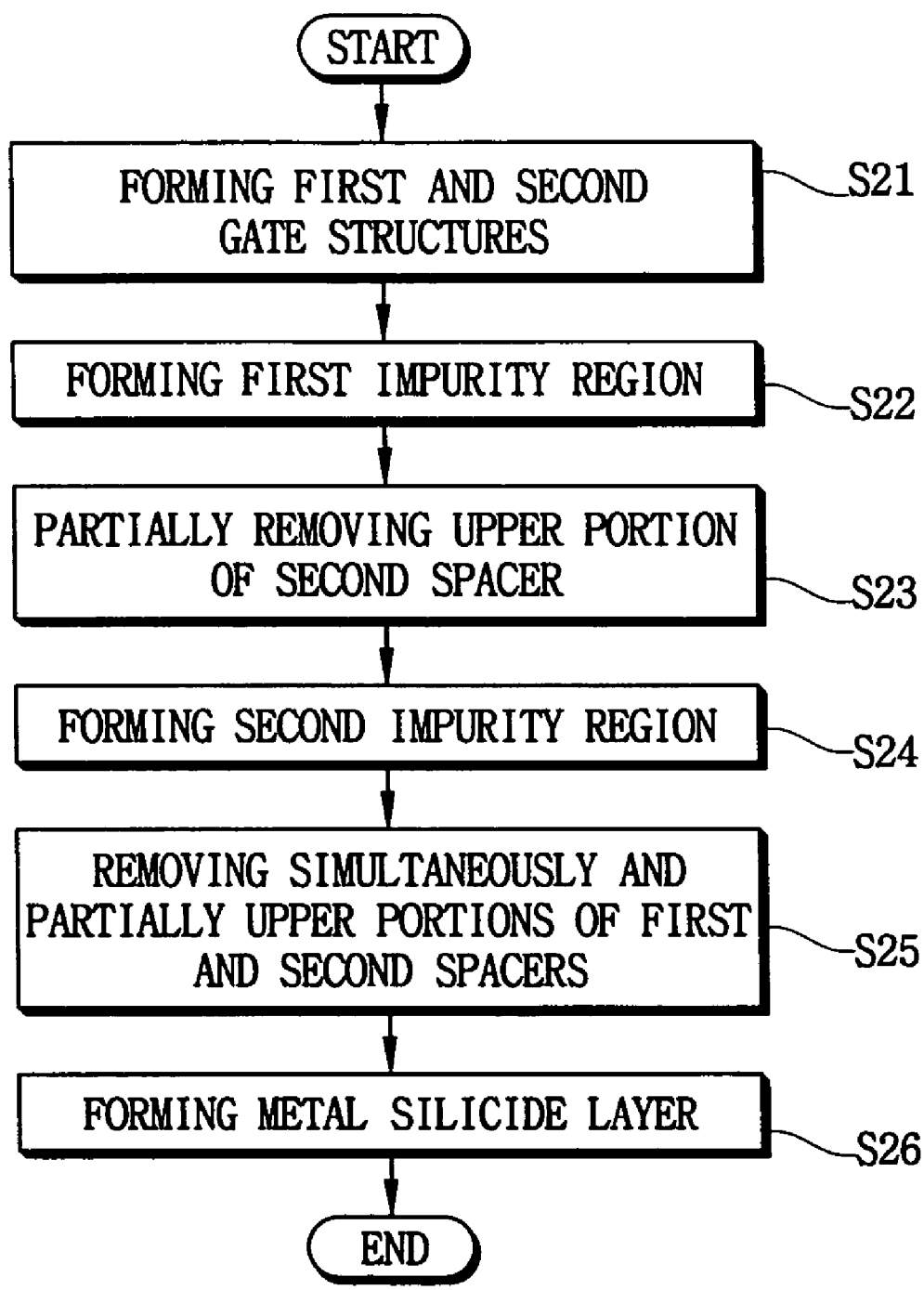

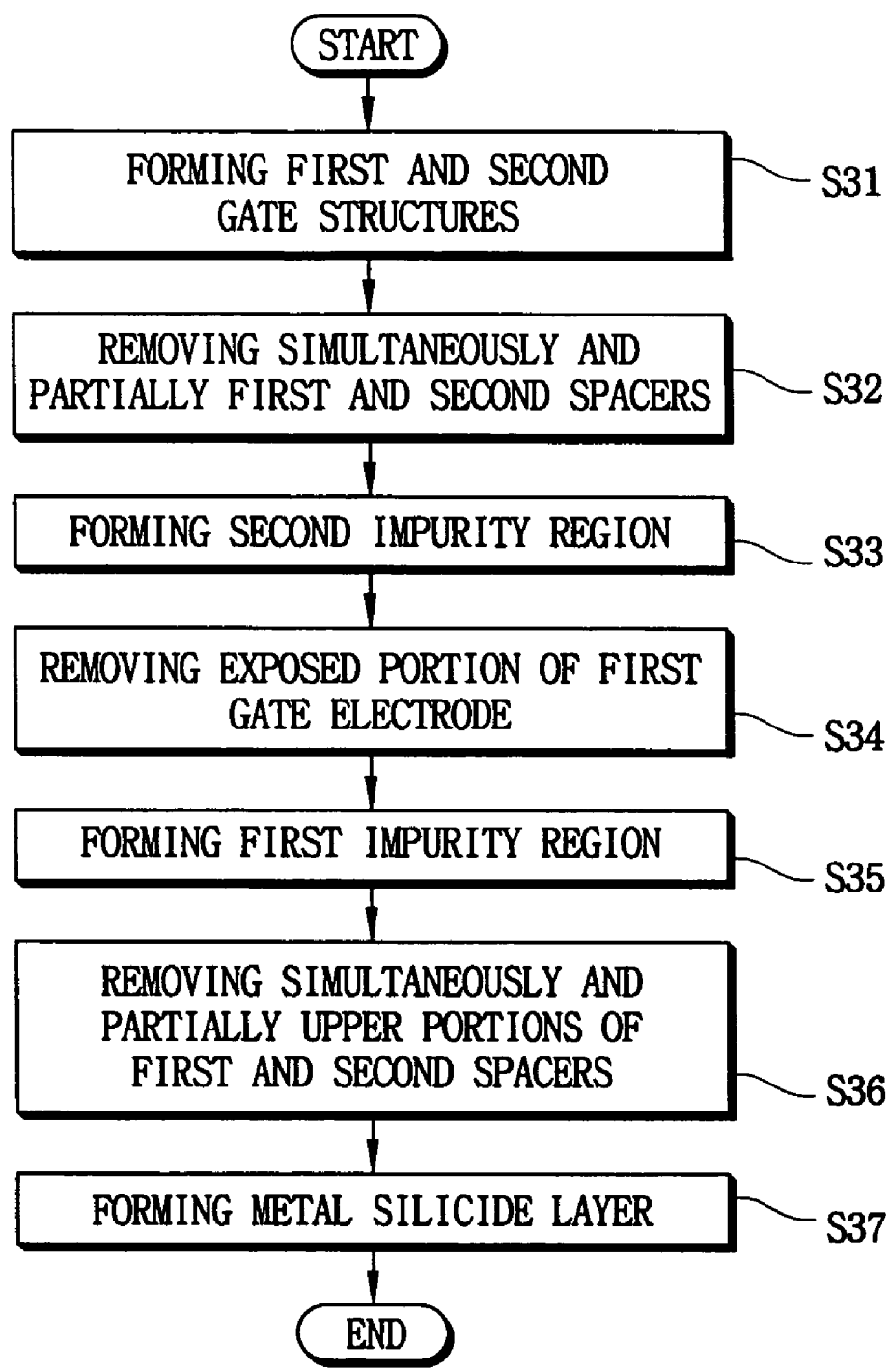

METHOD FOR FORMING A METAL SILICIDE LAYER IN A SEMICONDUCTOR DEVICE

CROSS REFERENCE TO RELATED APPLICATION

This application claims priority under 35 USC § 119 to Korean Patent Application 2003-14406 filed on Mar. 7, 2003, the contents of which are herein incorporated by reference in their entirety for all purposes.

BACKGROUND OF THE INVENTION

1. Field of the Invention

The present invention relates to a method for forming a metal silicide layer in a semiconductor device. More particularly, the present invention relates to a method for forming an improved metal silicide layer in a semiconductor device having an N type metal oxide semiconductor (MOS) transistor and a P type MOS transistor.

2. Description of the Related Art

In a semiconductor device having rapid processing speed requirements, certain regions of the device, such as an active region and a gate region, are formed to include a metal silicide layer. The metal silicide layer operates to decrease the contact resistance of the region. The metal silicide layer may include a compound of metal and silicon, for example, such as titanium silicide ($TiSi_2$), platinum silicide ($PtSi_2$), lead silicide ($PbSi_2$), cobalt silicide ($CoSi_2$) or nickel silicide ($NiSi_2$).

As the design rule of semiconductor device continues to be reduced, the metal silicide layer has become indispensable in the semiconductor device. Since the margin for forming the metal silicide layer becomes increasingly narrow as the design rule is reduced, the process for forming the metal silicide layer in the semiconductor device becomes more difficult. For example, when a cobalt silicide layer is formed in a semiconductor device having a critical dimension (CD) of about 90 nm, the margin for forming the cobalt silicide layer becomes extremely small. As a result, the cobalt silicide layer may not be stably formed on a gate electrode and source/drain regions of the device.

To overcome this limitation, it is necessary to broaden the area of the metal silicide layer formed on a gate structure. To accomplish this a method for concavely etching an upper surface of the gate structure has been developed. In another example, a method for increasing the exposed portion of the gate electrode formed in the metal silicide layer thereon has been developed. The exposed portion of the gate electrode is broadened by performing a space recess process on the gate structure. In this space recess process, an upper portion of a space disposed on a sidewall of the gate electrode is partially etched to expose the upper portion of the gate electrode, which includes polysilicon. The area of the metal silicide layer may also be broadened using the space recess process.

FIGS. 1A to 1E are cross-sectional views illustrating a conventional method for forming a cobalt silicide layer. FIG. 2 is a flow diagram illustrating a conventional method for forming a cobalt silicide layer.

Referring to FIG. 1A and FIG. 2, in step S11, a field isolation layer 115 is formed on a substrate 110 by a shallow trench isolation (STI) process so that an N type MOS in a first region and a P type MOS in a second region are formed on the substrate 110. An N type MOS structure and a P type MOS structure, each having a size on the nanometer scale, respectively, are formed in the first and second regions of the substrate 110.

First and second oxide layers 112 and 122 are formed on the first and second regions. Gate electrodes 130 and 140 of N type and P type MOS transistors are formed on the first and second oxide layers 112 and 122, respectively. Oxide layers 152 and 162, formed of middle temperature oxide (MTO), are provided on sidewalls of the N type and P type gate electrodes 130 and 140.

To form a cobalt silicide layer on the N type and P type gate electrodes 130 and 140, a recess process is performed. Lateral spacers 150 and 160, for example formed of silicon nitride, are formed on the sidewall oxide layers 152, 162. In step S12, upper portions of the spacers 150 and 160, respectively, are partially removed thereby exposing upper portions of the N type and P type gate electrodes 130 and 140. The recess process increases the exposed portions of the N type and P type gate electrodes 130 and 140, thereby broadening the contact area with a later-formed cobalt silicide layer formed on the exposed portions of the N type and P type gate electrodes 130 and 140.

Referring to FIG. 1B, in step S13, a photoresist pattern 120 is formed on the P type MOS transistor region, thereby protecting the P type MOS transistor region. Arsenic (As) ions are implanted into the N type MOS transistor region so that source/drain regions 142 are formed on the substrate 110 adjacent to the N type gate electrode 130. Here, while the N type gate electrode 130 has a small CD of below about 90 nm, arsenic ions have relatively a larger size and heavier weight than the CD of the N type gate electrode 130. Accordingly, when arsenic ions are implanted, the upper portion of the N type gate electrode 130 may be deformed into a dome shape. Also, when a high thermal process is performed for later forming the cobalt silicide layer, the cobalt silicide layer may be positioned adjacent to the spacer 150, causing mechanical stress between the spacer 150 and the applied to the cobalt silicide layer. Furthermore, voids may be formed in the cobalt silicide layer, thereby increasing the resistance of the cobalt silicide layer.

Referring to FIG. 1C, in step S14, the photoresist pattern 120 formed on the P type MOS transistor region is removed. A photoresist pattern 121 is formed on the N type MOS transistor region, thereby protecting the P type MOS transistor region. Boron (B) ions or gallium (Ga) ions are implanted into the P type MOS transistor region, thereby forming source/drain electrodes 142 adjacent to the P type gate electrode 140.

Referring to FIG. 1D, the photoresist pattern 121 formed on the N type MOS transistor region is removed. Cobalt is deposited on the N type and P type MOS transistor regions by a sputtering process to thereby form a cobalt layer 170. To prevent the resulting cobalt silicide from oxidizing, a titanium nitride (TiN) layer may be formed on the cobalt layer 170.

Referring to FIG. 1E and FIG. 2, in step S15, the cobalt layer 170 and the titanium nitride layer are treated through a rapid thermal process (RTP) so that a cobalt silicide layer 180 is formed on the N type and P type MOS transistor regions.

Remaining cobalt silicide layer and titanium nitride layer are removed using a rinsing solution including $H_2O_2$ and $H_2SO_4$.

In the above-mentioned conventional method for forming a cobalt silicide layer, when the spacer is over etched to a depth greater than about 300 Å, the silicon in the source/ drain regions and the field isolation layer may be partially removed along with the spacer, resulting in increased leakage current.

To prevent the over-etching, when the spacer is etched to the depth of less about 300 Å, the cobalt layer may be stably formed. However, when the cobalt layer is treated through a successive RTP process, an agglomeration may be generated in the silicide layer formed on the P type MOS gate electrode, resulting in increased gate resistance. Since P type polysilicon doped with impurities is thermally more unstable than N type polysilicon doped with impurities, the agglomeration of the cobalt silicide may be readily generated in the P type structures, though under the same conditions.

As a result, the conventional method for forming a cobalt silicide layer by the aforementioned recess process does not apply well to highly-integrated semiconductor devices having a design rule of below approximately 90 nm. To overcome the above-mentioned problem, a method of forming a metal silicide layer using nickel silicide has been developed. However, the resulting nickel silicide layer has been found to be thermally unstable.

Also, when impurities such as arsenic ions are implanted into the N type MOS gate structure on the nanometerscale, the upper portion of the N type MOS gate structure may be deformed, resulting in electrical degradation in the gate structure. Furthermore, since the P type polysilicon doped with impurities in the P type gate structure has inferior thermal stability, the cobalt silicide may become agglomerated during the RTP.

SUMMARY OF THE INVENTION

It is a feature of the present invention to provide a method for forming a metal suicide layer that can minimize deformation to the gate structure and improves thermal stability.

In accordance with one aspect of the present invention, a method for forming a metal silicide layer comprises forming a first gate structure and a second gate structure including first and second gate electrodes and first and second spacers, respectively, on first and second regions of a substrate. Upper portions of the first and second spacers are partially removed to different depths such that side portions of the the first and second gate electrodes are exposed by different amounts in thickness. A metal silicide layer is formed on the first and second regions of the substrate including the first and second gate electrodes. The metal is thermally treated to form a metal silicide layers on exposed portions of the first and second gate electrodes and source/drain regions adjacent to the first and second gate electrodes. The metal silicide layer on the first gate electrode and the metal silicide layer on the second gate electrode have different thicknesses.

In one embodiment, the first gate structure corresponds to a gate structure of an N type MOS transistor, and the second gate structure corresponds to a gate structure of a P type MOS transistor. A first impurity region is formed in the first region of the substrate adjacent to the first gate structure, prior to partially removing the first spacer.

In another embodiment, partially removing the first and second spacers comprises: partially removing the second spacer to expose upper side portions of the second electrode; and simultaneously and partially removing the first and second spacers to provide the first and second gate electrodes having the different exposed thicknesses, wherein the second thickness of the metal silicide layer formed on the second gate electrode is greater than the first thickness of the metal silicide layer formed on the first gate electrode.

In another embodiment, the exposed thickness of the first gate electrode is about 100 Å to about 300 Å, and the exposed thickness of the second gate electrode is about 100 Å to about 1,000 Å.

In another embodiment, partially removing the first and second spacers comprises: removing partially and simultaneously the first and second spacers to expose upper side portions of the first and second electrodes; removing the exposed upper portion of the first gate electrode; and removing partially and simultaneously the first and second spacers to provide the first and second gate electrodes having the different exposed thicknesses, wherein the second thickness of the metal silicide layer formed on the second gate electrode is greater than the first thickness of the metal silicide layer formed on the first gate electrode.

In another embodiment, the exposed thickness of the first gate electrode is about 100 Å to about 300 Å, and the exposed thickness of the second gate electrode is about 100 Å to about 1,000 Å.

In accordance with another aspect of the present invention, a method for forming a metal silicide layer comprises forming a first gate structure including a first gate electrode and a first spacer on a first region of a substrate. A second gate structure including a second gate electrode and a second spacer is formed on a second region of the substrate. The second spacer is partially removed to partially expose upper side portions of the second gate electrode. The first spacer and the second spacer are simultaneously and partially removed to expose upper side portions of the first and second gate electrodes having different exposed thicknesses. The exposed thickness of the second gate electrode is greater than that of the first gate electrode. A metal silicide layer is formed on the first and second regions of the substrate including the first and second gate electrodes.

In one embodiment, a first impurity region is formed in the first region of the substrate adjacent to the first gate structure prior to partially removing the second spacer, and wherein a second impurity region is formed in the second region of the substrate adjacent to the second gate structure prior to removing partially and simultaneously the first and second spacers.

In another embodiment, forming the first impurity region comprises: forming a first photoresist pattern on the substrate to expose the first region of the substrate; and doping a first impurity into the first region of the substrate using the first photoresist pattern as a first mask; and wherein forming the second impurity region comprises: forming a second photoresist pattern on the substrate to expose the second region of the substrate; and doping a second impurity into the second region of the substrate using the second photoresist pattern as a second mask.

In another embodiment, the first gate structure corresponds to a gate structure of an N type MOS transistor, and the second gate structure corresponds to a gate structure of a P type MOS transistor.

In another embodiment, the second spacer is removed by a thickness of about 100 Å to about 500 Å, and the first and second spacers are simultaneously removed by a thickness of about 100 Å to about 300 Å.

In accordance with still another aspect of the present invention, a method for forming a metal silicide layer comprises forming a first gate structure including a first gate electrode and a first spacer on a first region of a substrate. A second gate structure including a second gate electrode and a second spacer is formed on a second region of the substrate. The first and second spacers are simultaneously partially removed to expose upper side portions of the first and second gate structures. The exposed upper portion of first gate electrode is removed. The first and second spacers are simultaneously and partially removed to form the first and second gate electrodes having different exposed thicknesses. A metal silicide layer is formed on the first and second gate electrodes and first and second source/drain regions.

In one embodiment, a second impurity region is formed in the second region of the substrate adjacent to the second gate structure prior to removing the exposed portion of the first gate electrode, and the exposed portion of the first gate electrode is removed using a rinsing material that passively reacts to the second impurity region.

In another embodiment, a first impurity region is formed in the first region of the substrate adjacent to the first gate structure, after removing the exposed portion of the first gate electrode. In another embodiment, the first gate structure corresponds to a gate structure of an N type MOS transistor, and the second gate structure corresponds to a gate structure of a P type MOS transistor. In another embodiment, the rinsing material includes a $NH_4OH$, a $H_2O_2$ and a $H_2O$, for example, includes about 1 to about 3 by weight part of the $NH_4OH$, about 3 to about 5 by weight part of the $H_2O_2$, and about 15 to about 25 by weight part of the $H_2O$.

In another embodiment, the first and second spacers are removed by a thickness of about 10 Å to about 300 Å, and the first and second spacers are simultaneously removed by a thickness of about 200 Å to about 500 Å.

BRIEF DESCRIPTION OF THE DRAWINGS

The above and other features and advantages of the present invention will become readily apparent by reference to the following detailed description when considered in conjunction with the accompanying drawings wherein:

FIG. 4 is a flow diagram illustrating a method for forming a metal silicide layer according to one embodiment of the present invention;

FIG. 6 is a flow diagram illustrating a method for forming a metal silicide layer according to another embodiment of the present invention.

DETAILED DESCRIPTION OF THE INVENTION

FIGS. 3A to 3F are cross-sectional views illustrating a method for forming a metal silicide layer according to one embodiment of the invention. FIG. 4 is a flow diagram illustrating the method for forming a metal silicide layer according to one embodiment of the invention.

Figure 1A:
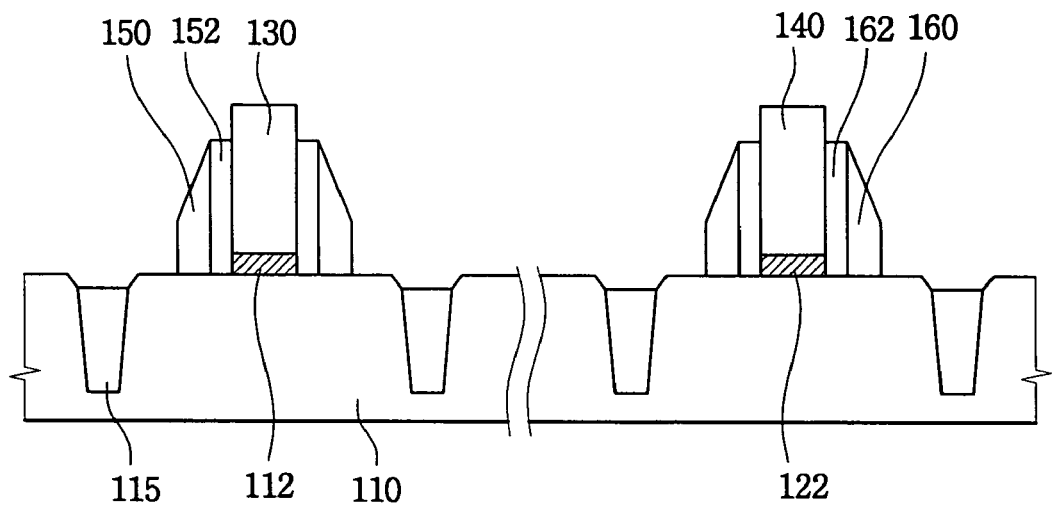
FIGS. 1A to 1E are cross-sectional views illustrating a conventional method for forming a cobalt silicide layer.
Figure 1B:
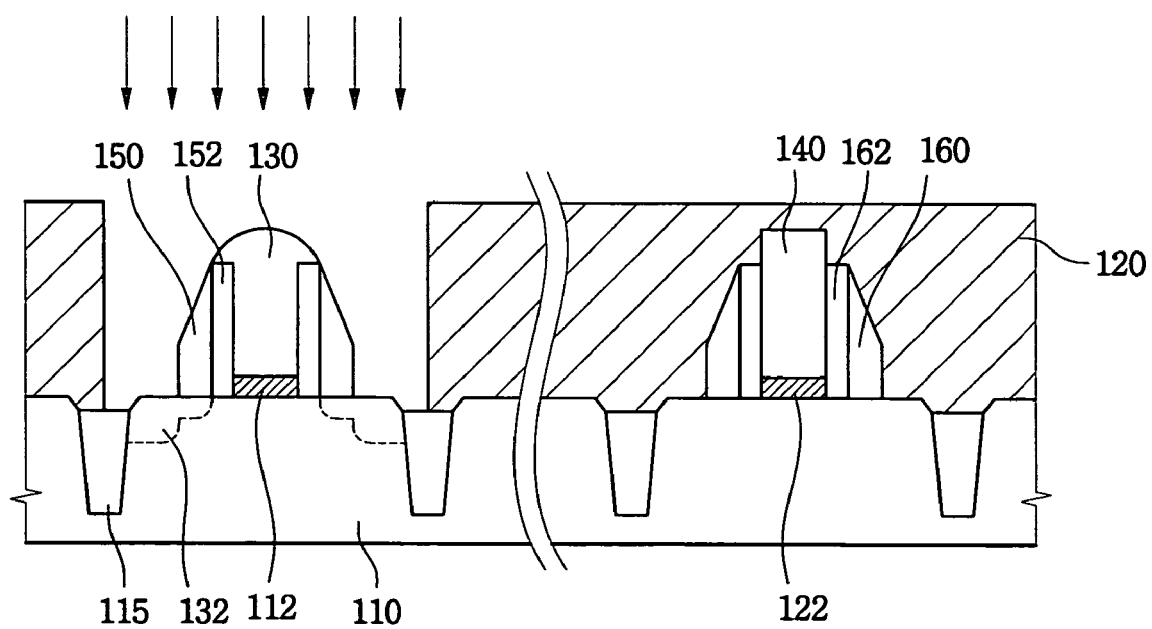
Figure 1C:
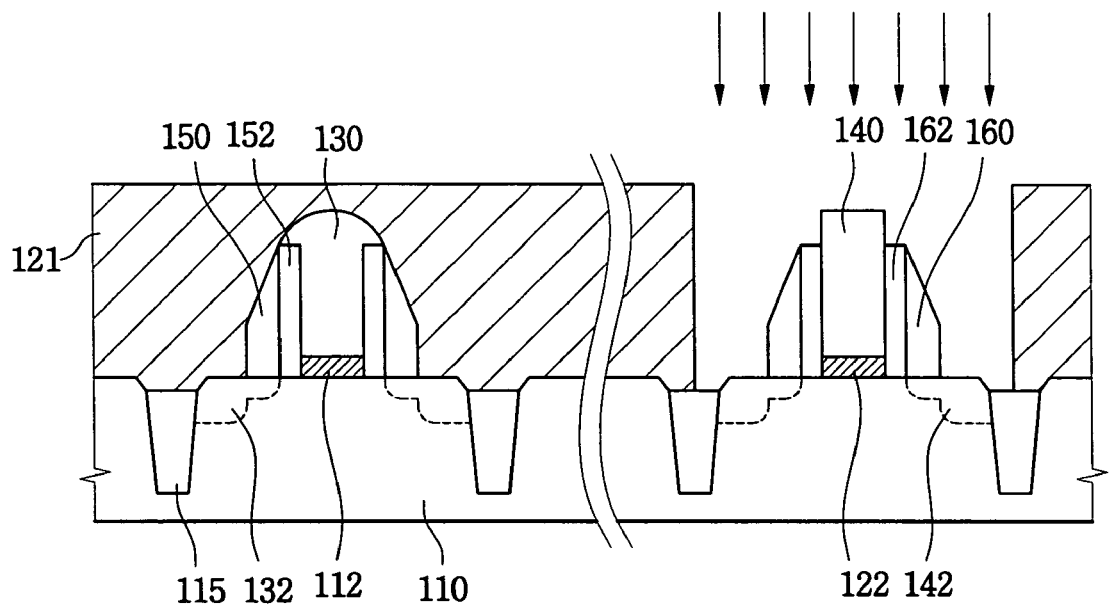
Figure 1D:
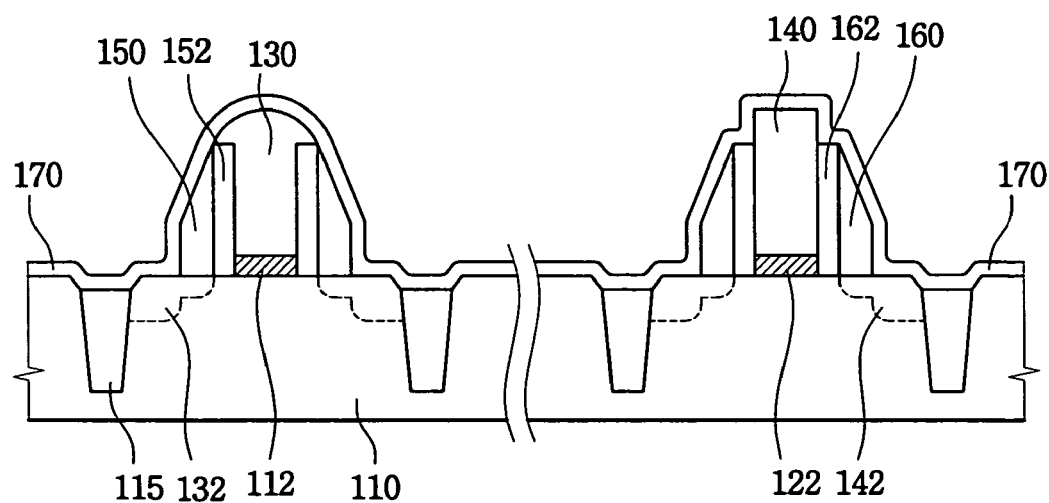
Figure 1E:
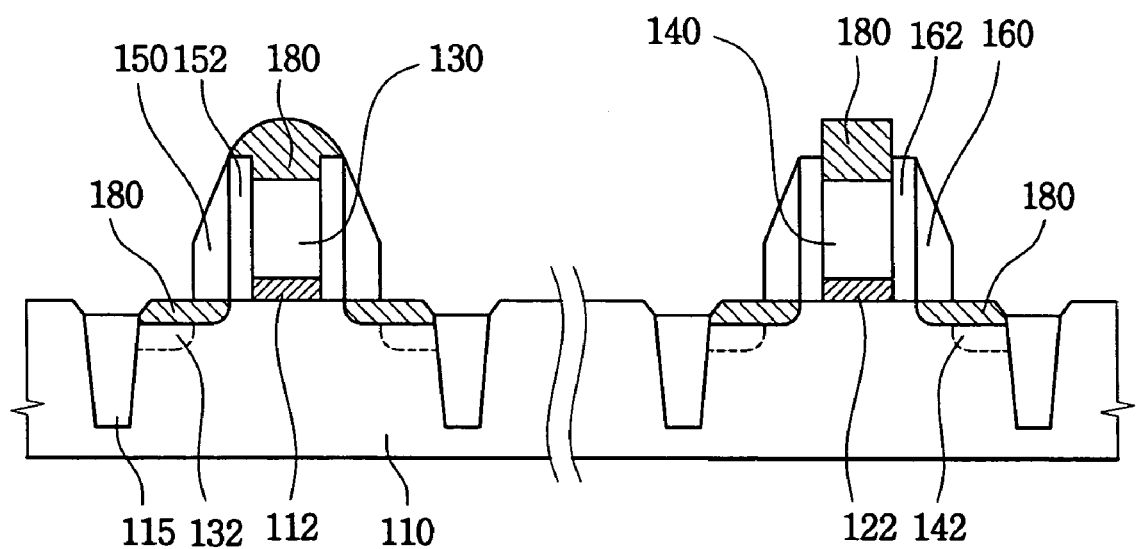
Figure 2:
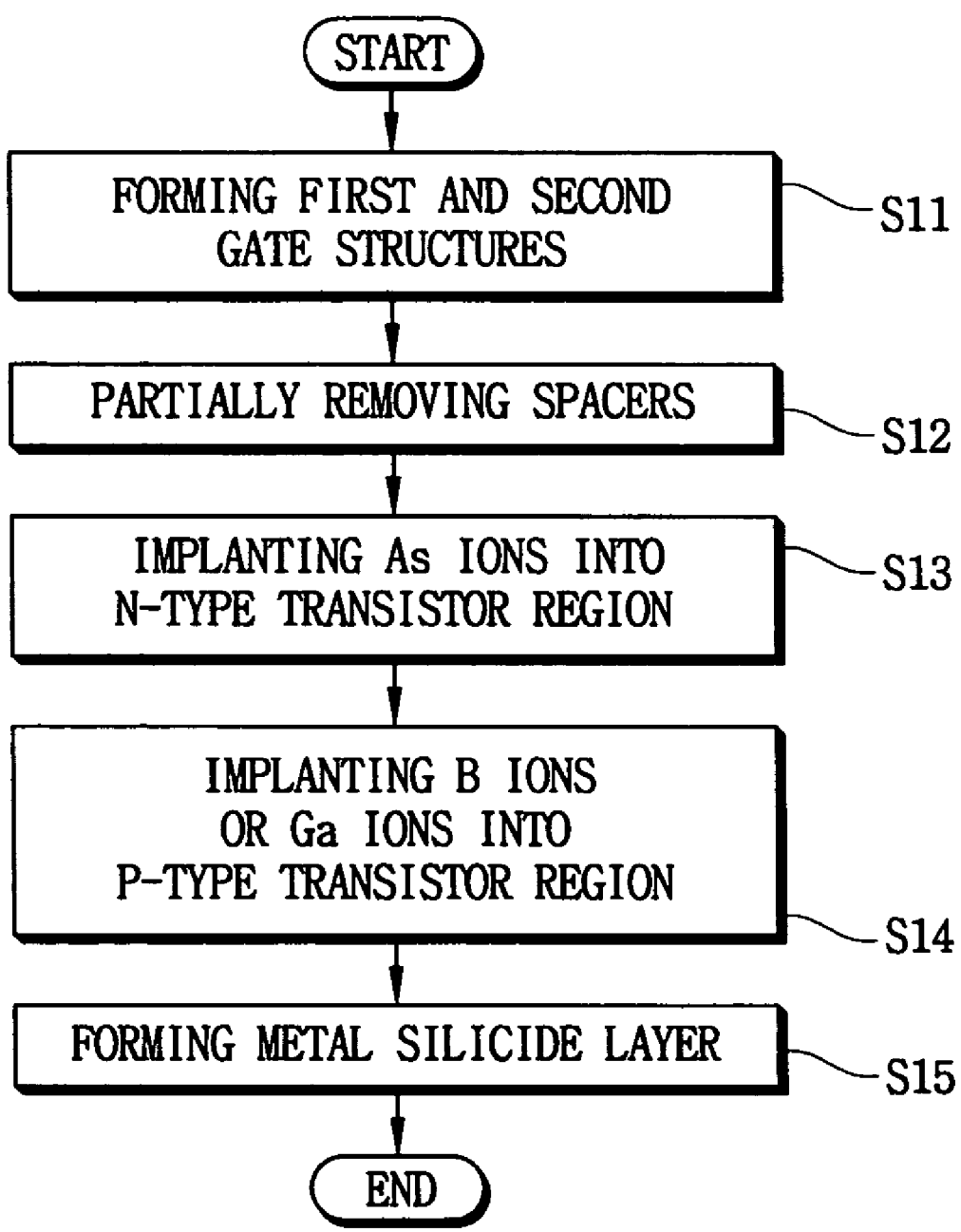
FIG. 2 is a flow diagram illustrating a conventional method for forming a cobalt silicide layer.
Figure 3A:
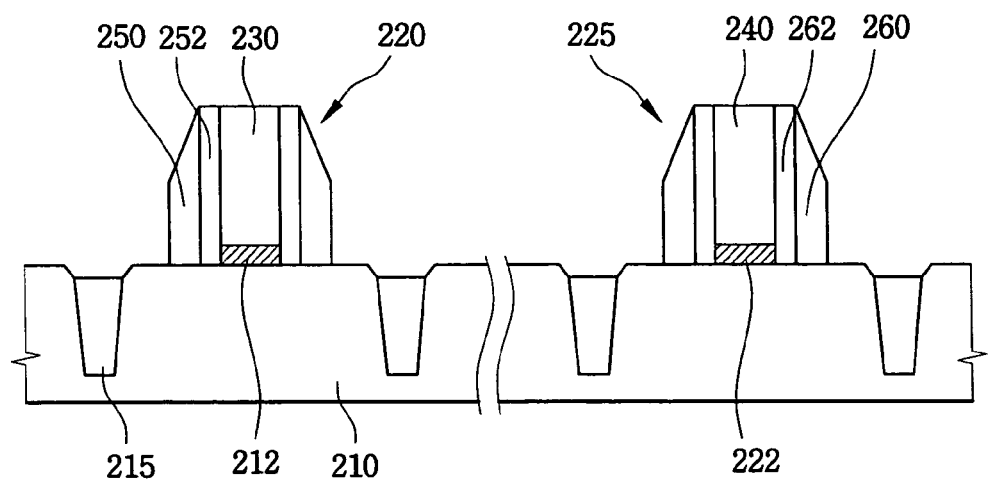
FIGS. 3A to 3F are cross-sectional views illustrating a method for forming a metal silicide layer according to one embodiment of the present invention.

Referring to FIG. 3A and FIG. 4, a field isolation layer 215 is formed on a substrate 210 by an STI process to define a first region and a second region in the substrate 210. The first and second regions may be included in an active region where a first MOS transistor and a second MOS transistor are formed.

In step S21, a first gate structure 220 is formed in the first region of the substrate 210 by a deposition process and an etching process. The first gate structure 220 has a first gate oxide layer 212, a first gate electrode 230, a first buffer layer 252 and a first spacer 250. In addition, a second gate structure 225 is formed in the second region of the substrate 210. The second gate structure 225 has a second gate oxide layer 222, a second gate electrode 240, a second buffer layer 262 and a second spacer 260.

The first and second buffer layers 252 and 262 and the first and second spacers 250 and 260 are partially etched to have inclined planes, respectively. The first and second gate electrodes 230 and 240 may include conductive material such as polysilicon. The first and second buffer layers 252 and 262 formed on sidewalls of the first and second gate electrodes 230 and 240, may include oxide such as MTO. The first and second spacers 250 and 260 surrounding the first and second buffer layers 252 and 262, may include nitride such as silicon nitride.

The first gate structure 220 may correspond to a gate structure of an N type MOS transistor whereas the second gate structure 225 may correspond to a gate structure of a P type MOS transistor. Accordingly, the first gate structure 220 of the N type MOS transistor is formed on the first region of the substrate 210. The second gate structure 225 of the P type MOS transistor is formed on the second region of the substrate 210.

Figure 3B:
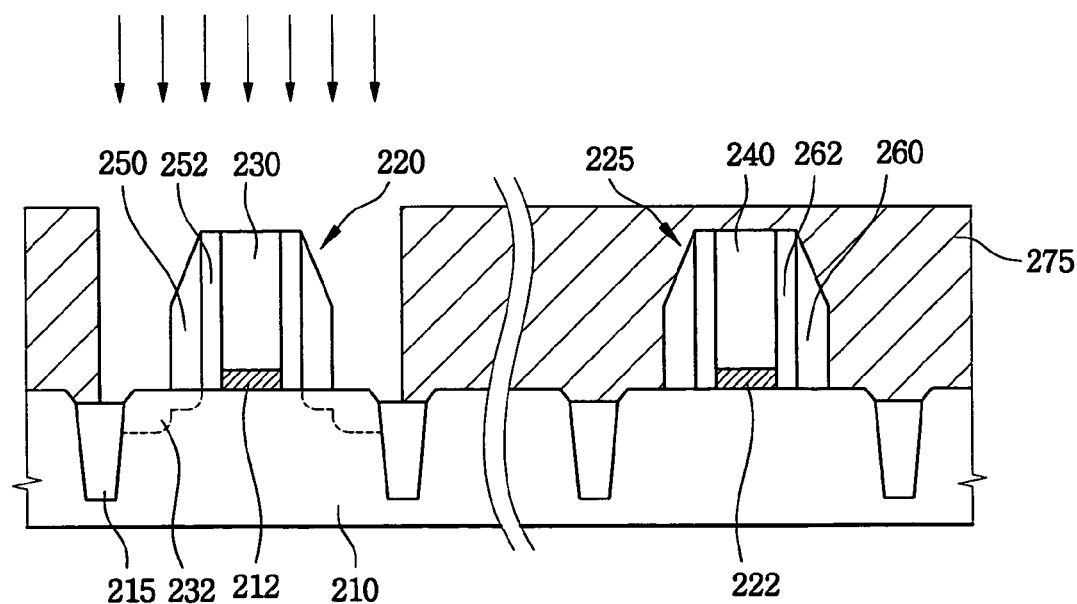

Referring to FIG. 3B and FIG. 4, in step S22, a first photoresist pattern 275 is formed by a photolithography process. The first region of the substrate 210 including the N type MOS transistor is exposed by the first photoresist pattern 275. Here, the second region of substrate 210 including the P type MOS transistor is protected by the first photoresist pattern 275.

Ions of Group V elements such as phosphorus (P) or arsenic (As) are implanted into the first region of the substrate 210 to form first source/drain regions 232 corresponding to first impurity regions adjacent to the first gate structure 220. Here, only the upper surface of the first gate electrode 230 is exposed without having performed a recess process on the first gate electrode 230. In this embodiment, since the recess process is not yet performed on the first gate electrode 230, deformation of the first gate electrode 230 is suppressed. Also, partial loss of the field isolation layer 215, a loss of which would otherwise result in increased junction leakage current, is prevented during the recess process in this embodiment.

Figure 3C:
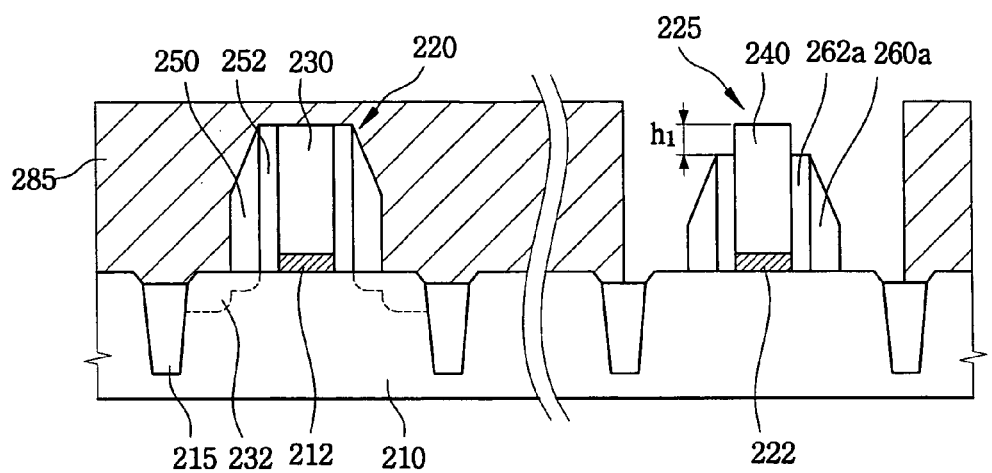

Referring to FIG. 3C and FIG. 4, in step S23, a second photoresist pattern 285 is formed on the first region of the substrate 210 by a photo process to expose the second region of the substrate 210 and to protect the first region of the substrate 210.

A dry etching process is performed on the second gate structure 225 positioned in the second region of the substrate 210 to remove the second buffer layer 262 of the second gate structure 225 and an upper portion of the second spacer 260 by a depth $h_1$ of about 100 Å to about 500 Å. Accordingly, a primarily etched second spacer 260a and a primarily etched second buffer layer 262a are formed, and also the upper portion of the second gate electrode 240 is partially exposed.

Figure 3D:
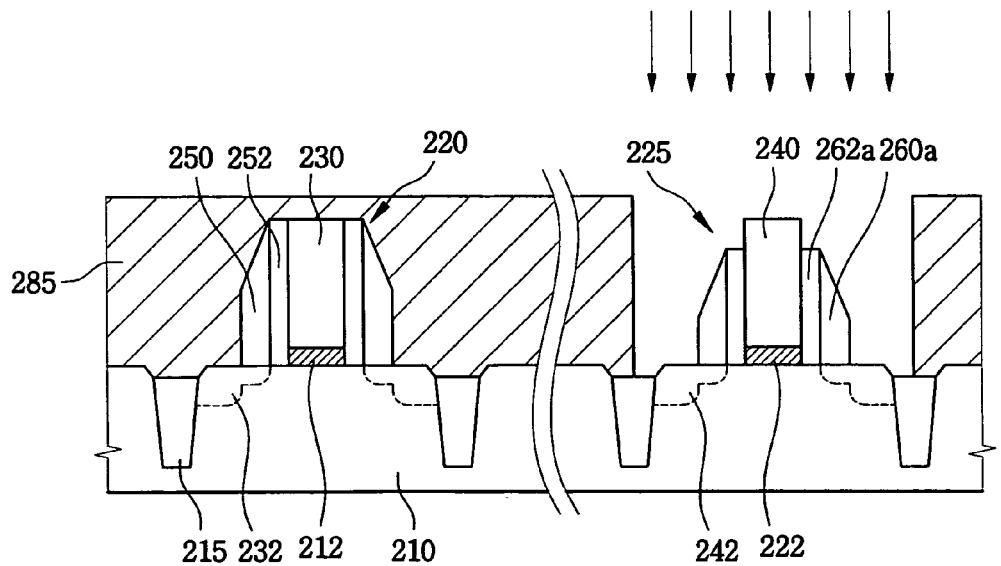

Referring to FIG. 3D and FIG. 4, in step S24, ions of Group III elements such as Ga or In are implanted into the exposed second region of the substrate 210 to form second source/drain regions 242 corresponding to second impurity regions adjacent to the second gate structure 225.

Figure 3E:
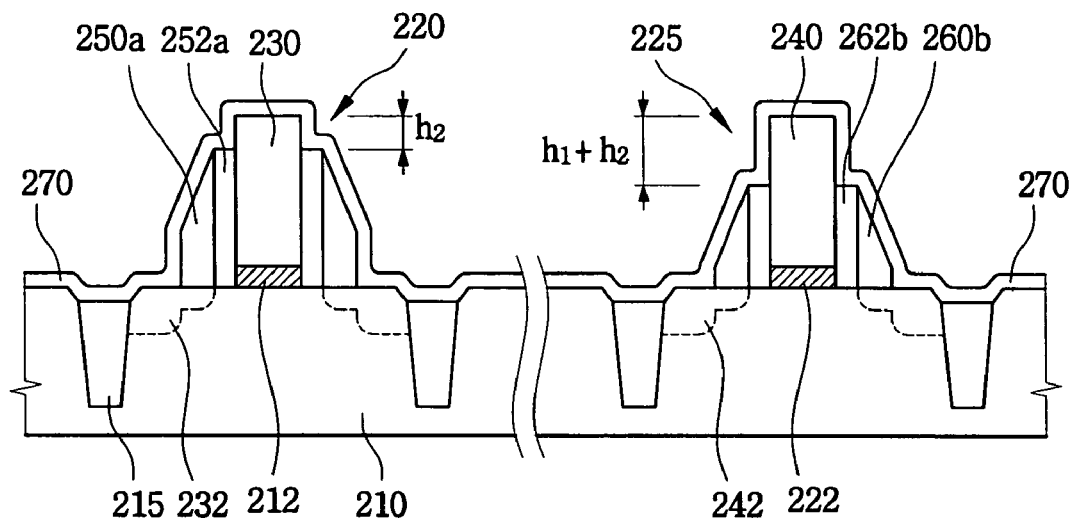

Referring to FIG. 3E and FIG. 4, in step S25, the second photoresist pattern 285 is removed. A wet etching process is performed on the substrate 210 having the first and second gate structures 220 and 225 using a phosphoric acid solution. The first spacer 250 and the primarily etched second spacer 260a are simultaneously etched by a depth $h_2$ of about 100 Å to about 300 Å by the wet etching process with an etching selectivity between oxide and silicon. Accordingly, a primarily etched first spacer 250a and a secondarily etched second spacer 260b are formed, and also the upper portion of the first gate electrode 230 is partially exposed. The exposed thickness $h_1+h_2$ of the second gate electrode 240 is thicker than that $h_2$ of the first gate electrode 230.

A cobalt layer 270 having a thickness of about 50 Å to about 150 Å is formed on the entire surface of the substrate 210 through a sputtering process. Other materials such as tungsten (W), titanium (Ti), tantalum (Ta), etc., may be used instead of cobalt. To prevent the cobalt silicide layer from oxidizing, a titanium nitride layer (not shown) may be formed on the cobalt layer 270.

Figure 3F:
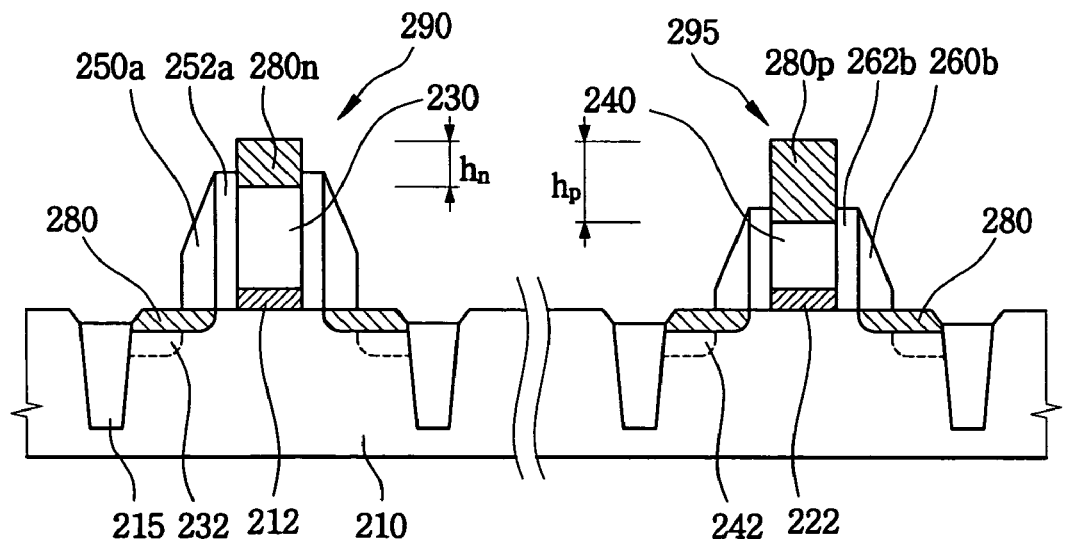

Referring to FIG. 3F and FIG. 4, the substrate 210 having the cobalt layer 270 is treated through the RTP at a temperature of about 650° C. to about 750° C. to form first, second and third cobalt silicide layers 280n, 280p and 280.

In step S26, any remaining cobalt layer that is not reacted with the substrate 210 is removed using a cleaning solution including $H_2O_2$ and $H_2SO_4$. Accordingly, the third cobalt silicide layer 280 is formed on the first and second source/drain regions 232 and 242 the first and second cobalt silicide layers 280n and 280p are formed on the first and second gate electrodes 230 and 240. Particularly, in step S26, a second thickness hp of the second cobalt silicide layer 280p formed on the second gate electrode 240 is thicker than a first thickness $h_n$ of the first cobalt silicide layer 280n formed on the first gate electrode 230. A first transistor 290 and a second transistor 295 are completed on the first and second regions of the substrate 210. The first transistor 290 may correspond to the N type MOS transistor, and the second transistor 295 may correspond to the P type MOS transistor.

According to one embodiment of the invention, since the exposed thickness of the second gate electrode 240 is thicker than that of the first gate electrode 230, the second thickness $h_p$ of the second cobalt silicide layer 280p formed on the second gate electrode 240 is thicker than the first thickness $h_n$ of the first cobalt silicide layer 280n formed on the first gate electrode 230.

FIGS. 5A to 5G are cross sectional views illustrating a method for forming a metal silicide layer according to another embodiment of the invention. FIG. 6 is a flow diagram illustrating a method for forming a metal silicide layer according to another embodiment of the invention.

Figure 5A:
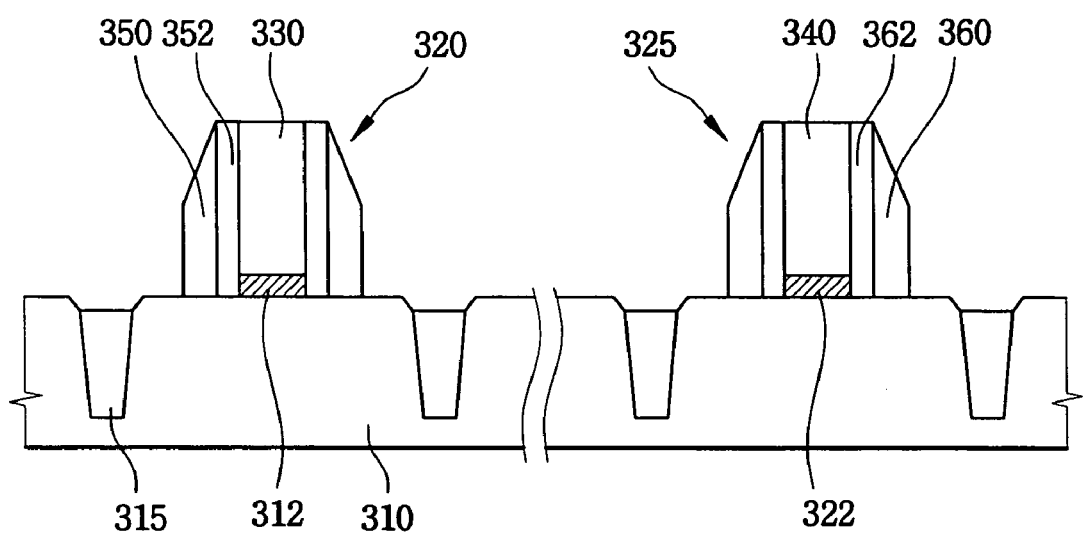
FIGS. 5A to 5G are cross-sectional views illustrating a method for forming a metal silicide layer according to another embodiment of the present invention.

Referring to FIG. 5A and FIG. 6, a field isolation layer 315 is formed in a substrate 310 using an STI process to define a first region and a second region in the substrate 310. The first and second regions correspond to active regions formed thereon first and second MOS transistors.

In step S31, a first gate structure 320 is formed on the first region of the substrate 310 through a depositing process and an etching process. A second gate structure 325 is formed on the second region of the substrate 310 through the depositing and etching processes. The first gate structure 320 includes a first gate oxide layer 312, a first gate electrode 330, a first buffer layer 352 and a first spacer 350. The second gate structure 325 has a second gate oxide layer 322, a second gate electrode 340, a second buffer layer 362 and a second spacer 360.

The first and second gate electrodes 330 and 340 may include a conductive material such as polysilicon. The first and second buffer layers 352 and 362 may include oxide such as MTO. The first and second spacers 350 and 360 may include nitride such as silicon nitride. The first gate structure 320 may correspond to a gate structure of an N type MOS-transistor. The second gate structure 325 may correspond to a gate structure of a P type MOS transistor.

Figure 5B:
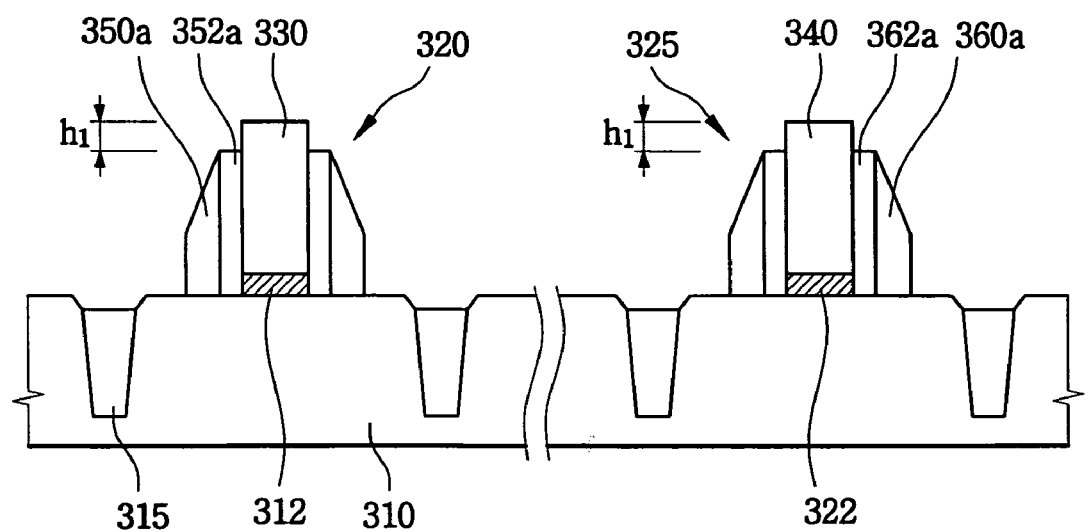

Referring to FIG. 5B and FIG. 6, in step S32, the first and second spacers 350 and 360 are simultaneously etched by a stripping process using a phosphoric acid solution by a depth $h_1$ of about 10 Å to about 300 Å. Upper portions of the first and second gate electrodes 330 and 340 are exposed. As a result, the first gate structure 320 has a primarily etched first spacer 350a and a first-etched first buffer layer 352a, and the second gate structure 325 has a first etched second spacer 360a and a first etched second buffer layer 362a.

Figure 5C:
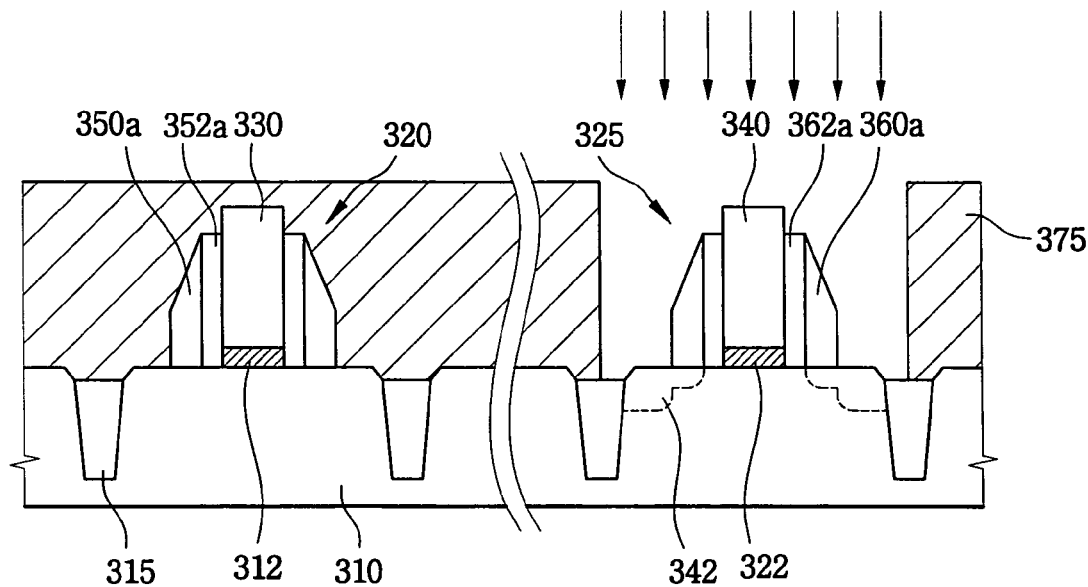

Referring to FIG. 5C and FIG. 6, in step S33, a first photoresist pattern 375 is formed on the substrate 310 to expose the second region of the substrate 310 and to protect the first region of the substrate 310. Ions of Group III elements such as Ga or In are implanted into the second region of the substrate 310 to form second source/drain regions corresponding to a second impurity region adjacent to the second gate structure 325.

Figure 5D:
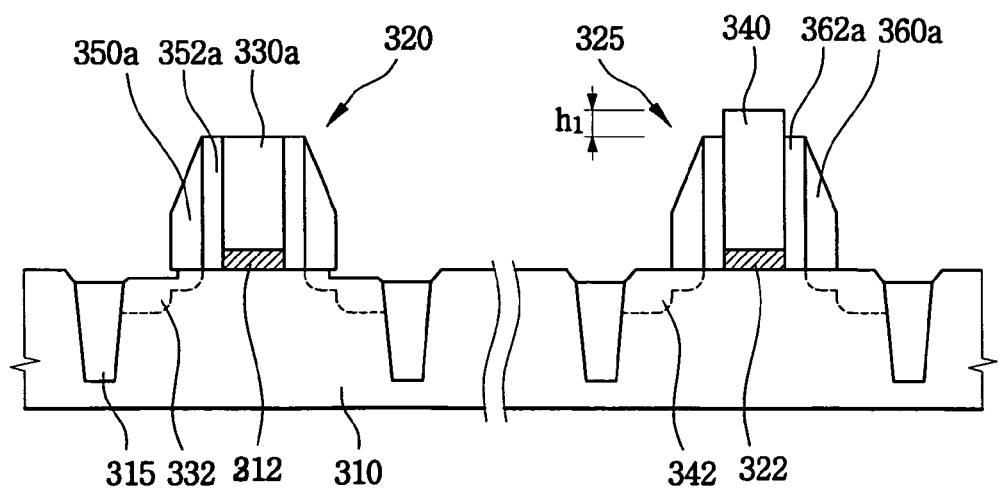

Referring to FIG. 5D and FIG. 6, in step S34, the first photoresist pattern 375 is removed through an ashing process or a stripping process. Here, while the second impurity region is formed in the second region of the substrate 310, the first region of the substrate 310 has no impurity region. Accordingly, silicon in the first region of the substrate 310 may be selectively removed by using materials that be passively reacted with p-type materials doped with impurity and be actively reacted with silicon.

In this embodiment, the substrate 310 is rinsed by using a standard clean 1 (SC 1) solution including $NH_4OH$, $H_2O_2$ and $H_2O$ so that the silicon in the first region of the substrate 310 is selectively removed. The SC1 solution may include about 1 to about 3 by weight part of $NH_4OH$, about 3 to about 5 by weight part of $H_2O_2$, and about 15 to about 25 by weight part of $H_2O$.

Pure silicon has a high etching selectivity relative to impurity-doped silicon when the SC1 solution is used. Accordingly, the silicon in the first region of the substrate 310 may be readily etched and the second impurity region 342 of the second region may be minimally etched by the SC1 solution, respectively. When the substrate 310 is rinsed using the rinsing solution, the silicon in the first region is etched so that the exposed portion of the first gate electrode 330 is removed. At the same time, silicon corresponding to the first source/drain regions adjacent to the first gate structure 320 is also etched. As a result, during later ion implantation of the first source/drain regions, ions such as P or As are only implanted into the upper portion of the first-etched first gate electrode 330a. Accordingly, deformation of the first gate structure 320 is suppressed, and the junction leakage current owing to the loss of the field isolation layer 315 is also suppressed.

A second photoresist pattern (not shown) is formed on the substrate 310 to protect the second region of the substrate 310 and to expose the first region of the substrate 310. Ions of group V elements such as P or As are implanted into the exposed first region of the substrate 310 to form source/drain regions 332 corresponding to a first impurity region adjacent to the first gate structure 320. Since only the upper portion, and not side portions, of the primarily etched first gate electrode 330a is exposed, deformation of the primarily etched first gate electrode 330a is suppressed during the ion implanting process. The second photoresist pattern is then removed.

Figure 5E:
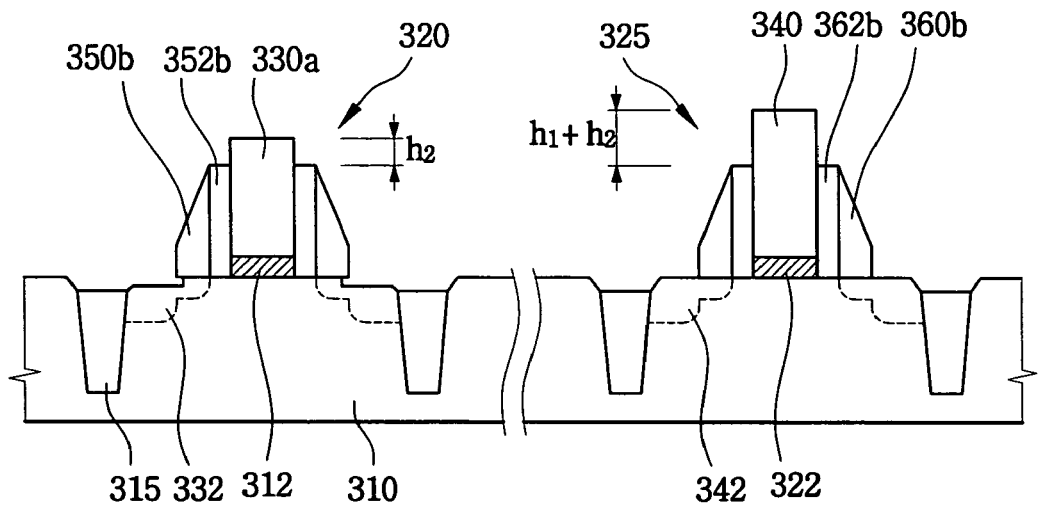

Referring to FIG. 5E and FIG. 6, in step S35, a wet etching process is performed on the substrate 310 having the first and second gate structures 320 and 325 using a phosphoric acid solution. The upper portions of the primarily etched first and second spacers 350a and 360a are simultaneously etched by a depth $h_2$ of about 200 Å to about 500 Å. The upper portion of the primarily etched first gate electrode 330a is exposed, and simultaneously the second gate electrode 340 having the previously exposed portion is further exposed. Accordingly, the exposed thickness of the second gate electrode 340 is greater than that of the primarily etched first gate electrode 330a.

Figure 5F:
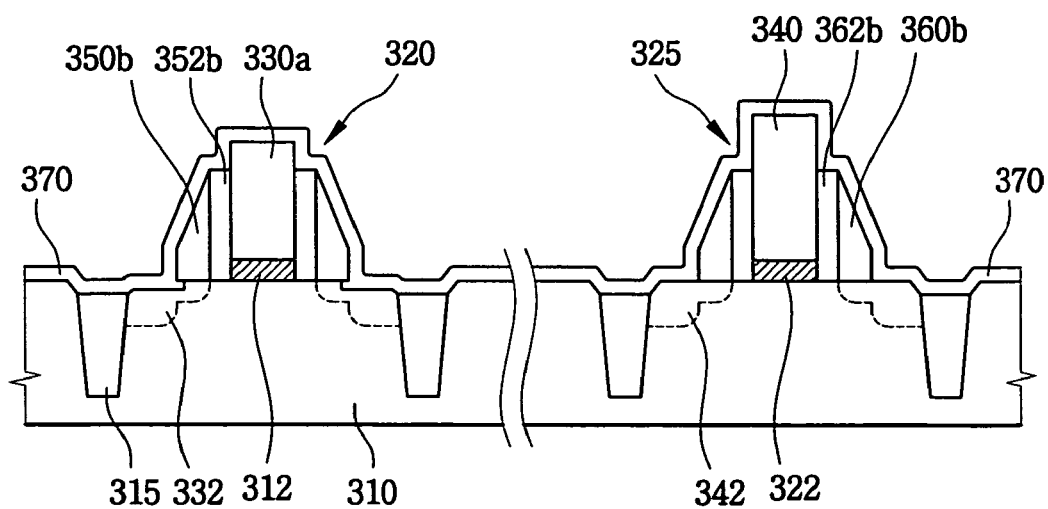

Referring to FIG. 5F, in step S36, a cobalt layer 370 having a thickness of about 50 Å to about 150 Å is formed on the entire surface of the substrate 310 having the first and second structures 320 and 325 using a sputtering process. In alternative embodiments, other materials such as tungsten (W), titanium (Ti), tantalum (Ta), etc., may be used instead of cobalt. To prevent a cobalt silicide layer from oxidizing, a titanium nitride layer (not shown) may be formed on the cobalt layer 370.

Figure 5G:
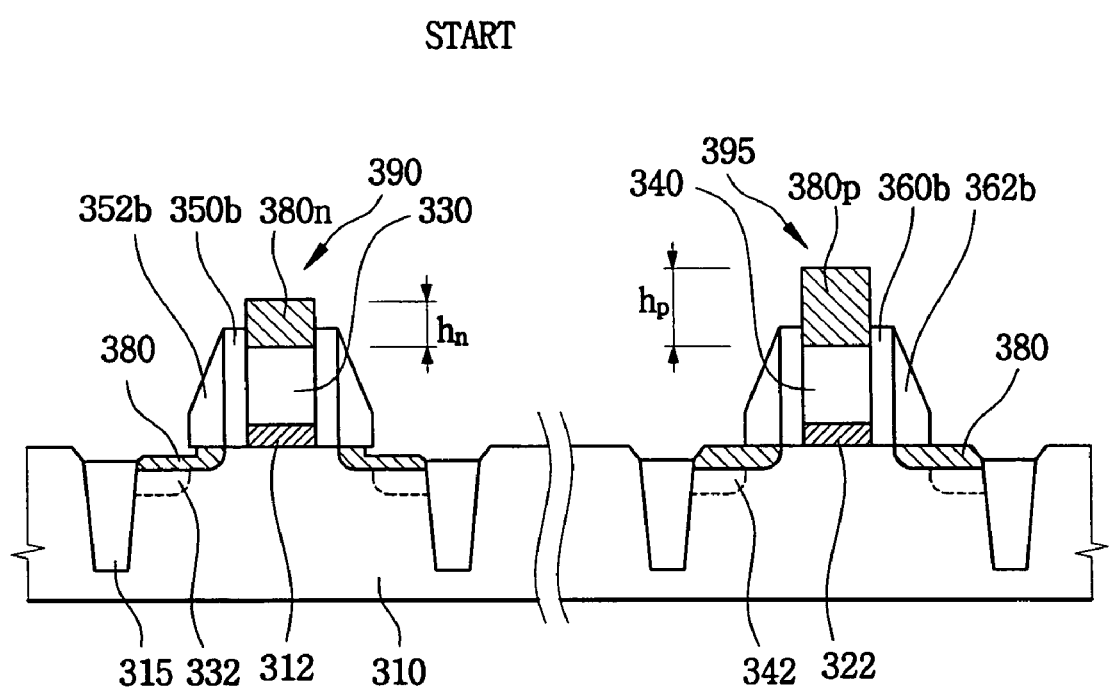

Referring to FIG. 5G and FIG. 6, in step S37, the substrate 310 having the cobalt layer 370 is treated through the RTP process at a temperature of about 650° C. to about 750° C. to form first, second and third cobalt suicide layers 380n, 380p and 380.

Any remaining cobalt layer that is not reacted with the substrate 310 is removed by using a rinsing solution including $H_2O_2$ and $H_2SO_4$. Accordingly, the third cobalt silicide layer 380 is formed on the first and second source/drain regions 332 and 342. The first and second cobalt silicide layers 380n and 380p are formed on the first and second gate electrodes 330 and 340. Particularly, in step S37, a second thickness $h_p$ of the second cobalt silicide layer 380p formed on the second gate electrode 340 is thicker than a first thickness $h_n$ of the first cobalt silicide layer 380n formed on the first gate electrode 330. A first transistor corresponding to the N type MOS transistor is formed on the first region of the substrate 310. A second transistor corresponding to the P type MQS transistor is formed on the second region of the substrate 310. Since the exposed thickness of the second gate electrode 340 is greater than that of the first gate electrode 330, the second thickness $h_p$ of the second cobalt silicide layer 380p formed on the second gate electrode 340 is greater than the first thickness hn of the first cobalt silicide layer 380n formed on the first gate electrode 330.

When a metal silicide layer is formed in a highly integrated semiconductor device having a critical dimension of less than about 100 nm, the method according to the invention prevents the gate structure from deforming, thereby preventing degradation of the resulting semiconductor device.

Also, the method of the invention helps to prevent junction leakage current caused by loss of the field isolation layer.

Furthermore, a metal silicide layer having sufficient thickness is formed on the gate electrodes and the impurity-doped regions so that the contact resistance of the semiconductor device is substantially reduced.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method for forming a metal silicide layer in a semiconductor device comprising:
    forming a first gate structure including a first gate electrode and a first spacer on a first region of a substrate;
    forming a second gate structure including a second gate electrode and a second spacer on a second region of the substrate;
    partially removing the first and second spacers to different depths such that side portions of the first and second gate electrodes are exposed by different amounts in thickness; and
    forming a metal silicide layer on the first and second electrodes having the different exposed thicknesses,
    wherein the metal silicide layer formed on the second gate electrode has a second thickness that is different from a first thickness of the metal silicide layer formed on the first gate electrode.

2. The method of claim 1, wherein the first gate structure corresponds to a gate structure of an N type MOS transistor, and the second gate structure corresponds to a gate structure of a P type MOS transistor.

3. The method of claim 1, wherein a first impurity region is formed in the first region of the substrate adjacent to the first gate structure, prior to partially removing the first spacer.

4. The method of claim 1, wherein partially removing the first and second spacers comprises:
    partially removing the second spacer to expose upper side portions of the second electrode; and
    simultaneously and partially removing the first and second spacers to provide the first and second gate electrodes having the different exposed thicknesses,
    wherein the second thickness of the metal silicide layer formed on the second gate electrode is greater than the first thickness of the metal silicide layer formed on the first gate electrode.

5. The method of claim 4, wherein the exposed thickness of the first gate electrode is about 100 Å to about 300 Å, and the exposed thickness of the second gate electrode is about 100 Å to about 1,000 Å.

6. A method for forming a metal silicide layer in a semiconductor device comprising:
    forming a first gate structure including a first gate electrode and a first spacer on a first region of a substrate;
    forming a second gate structure including a second gate electrode and a second spacer on a second region of the substrate;
    partially removing the second spacer to partially expose upper side portions of the second gate electrode;
    removing partially and simultaneously the first and second spacers; and
    forming a metal silicide layer on the first and second gate electrodes,
    wherein a second thickness of the metal silicide layer formed on the second gate electrode is greater than a first thickness of the metal silicide layer formed on the first gate electrode.

7. The method of claim 8, wherein a first impurity region is formed in the first region of the substrate adjacent to the first gate structure prior to partially removing the second spacer, and wherein a second impurity region is formed in the second region of the substrate adjacent to the second gate structure prior to removing partially and simultaneously the first and second spacers.

8. The method for forming a metal silicide layer in a semiconductor device of claim 7, wherein forming the first impurity region comprises:

forming a first photoresist pattern on the substrate to expose the first region of the substrate; and doping a first impurity into the first region of the substrate using the first photoresist pattern as a first mask; and wherein forming the second impurity region comprises:

forming a second photoresist pattern on the substrate to expose the second region of the substrate; and doping a second impurity into the second region of the substrate using the second photoresist pattern as a second mask.

9. The method of claim 8, wherein the first gate structure corresponds to a gate structure of an N type MOS transistor, and the second gate structure corresponds to a gate structure of a P type MOS transistor.

10. The method of claim 8, wherein the second spacer is removed by a thickness of about 100 Å to about 500 Å, and the first and second spacers are simultaneously removed by a thickness of about 100 Å to about 300 Å.

* * * * *

UNITED STATES PATENT AND TRADEMARK OFFICE
CERTIFICATE OF CORRECTION

| | | |
|---|---|---|
| PATENT NO. | : 7,005,373 B2 | |
| APPLICATION NO. | : 10/790921 | |
| DATED | : February 28, 2006 | |
| INVENTOR(S) | : Eung-Joon Lee, In-Sun Park and Kwan-Jong Roh | |

It is certified that error appears in the above-identified patent and that said Letters Patent is hereby corrected as shown below:

At Column 10, Claim 7, Line 63, please delete "8" and insert --6--.

Signed and Sealed this

First Day of August, 2006

JON W. DUDAS
*Director of the United States Patent and Trademark Office*